United States Patent [19]
Doughty

[11] Patent Number: 5,978,399
[45] Date of Patent: Nov. 2, 1999

[54] ELECTRICALLY-TUNABLE INFRARED DETECTORS AND METHOD BASED ON INTRABAND TRANSITIONS IN QUANTUM WELL STRUCTURES

[76] Inventor: Kathryn L. Doughty, 5531 Somerset Dr., Santa Barbara, Calif. 93111

[21] Appl. No.: 08/985,113

[22] Filed: Dec. 4, 1997

Related U.S. Application Data

[60] Provisional application No. 60/032,540, Dec. 10, 1996.

[51] Int. Cl.⁶ .............................. H01S 3/19; H01L 29/06; G01J 5/00
[52] U.S. Cl. ................................. 372/45; 372/43; 372/44; 372/50; 257/14; 257/21; 250/338.1; 250/338.4; 250/340
[58] Field of Search ................................. 372/43, 44, 50, 372/45; 257/14, 15, 21, 22; 250/338.1, 338.4, 339.02, 340

[56] References Cited

U.S. PATENT DOCUMENTS

| | | | |
|---|---|---|---|
| 4,620,214 | 10/1986 | Margalit et al. ...................... | 257/17 X |
| 4,873,555 | 10/1989 | Coon et al. ............................ | 257/18 X |
| 4,903,101 | 2/1990 | Maserjian ............................... | 257/17 X |
| 5,077,466 | 12/1991 | Delacourt et al. ..................... | 257/17 X |
| 5,355,000 | 10/1994 | Delacourt et al. ...................... | 257/14 |
| 5,528,051 | 6/1996 | Nuyen ..................................... | 257/17 |
| 5,539,206 | 7/1996 | Schimert .............................. | 250/338.4 |
| 5,629,522 | 5/1997 | Martin et al. ........................ | 250/338.4 |
| 5,645,421 | 7/1997 | Liu .......................................... | 257/21 |
| 5,661,590 | 8/1997 | Almogy et al. ....................... | 359/248 |
| 5,844,253 | 12/1998 | Kim et al. ................................ | 257/24 |

*Primary Examiner*—Brian Healy
*Attorney, Agent, or Firm*—Owen L. Lamb

[57] ABSTRACT

A quantum well infrared detector comprised of a quantum well semiconductor structure having two adjacent quantum states. The structure is electrically tunable by photon induced resonant tunneling between the quantum wells. An infrared tunable detector device having a large responsivity, sharp line width and wide tunability is defined by the following characteristics: a transmission matrix element in the range of $1.1 \times 10^{17}/nm$ to $1.5 \times 10^{17}/nm$; and a tuning distance in the range of 20 Å to of 70 Å.

27 Claims, 3 Drawing Sheets

ELECTRICALLY-TUNABLE INFRARED DETECTORS AND METHOD BASED ON INTRABAND TRANSITIONS IN QUANTUM WELL STRUCTURES

CROSS-REFERENCE TO RELATED APPLICATIONS

This application is a continuation of Provisional Application Ser. No. 60/032540 filed Dec. 10, 1996, pending, on behalf of Kathryn L. Doughty.

BACKGROUND OF THE INVENTION

1. Field of the Invention

The present invention relates to detectors based on intraband transitions in quantum well structures and more specifically to an electrically-tunable infrared detector exhibiting large responsivity, sharp line width, which determines resolution of the detector, and wide tunability.

2. Prior Art

Infrared detectors in the prior art have various advantages, both in terms of quality measures such as responsivity, bandwidth, speed, and tunability, and in terms of such things as ease of fabrication, reliability, and cost. All related detectors rely on specific quantum transitions to convert electromagnetic radiation to a detectable voltage or current. The most commonly used such transitions can be divided into three types: interband transitions, confined-to-confined intraband transitions, and confined-to extended intraband transitions.

In interband transitions, an electron is excited from a state in the valance band (either from the bulk valence band, or from a heterostructure confined state) to states in the conduction band. The absorption for this kind of transition can be very strong, due to the large number of available electrons in the initial state.

In confined-to-confined intraband transitions, both the initial and final states are confined conduction-band or valence-band states induced by band-gap engineering. In this case, the absorption is due to envelope function overlap, and this transition probability can be very large. In many cases this results in absorption features as strong for a single quantum well of 100 Å as for bulk samples of thickness of a few 1000 Å (the order of an absorption length). While these transitions have the advantage of a more sharply defined absorption bandwidth, they often suffer in terms of population of the initial state.

Finally, there are confined-to-extended intraband transitions, in which the transition is between an initial confined-state and the conduction-band continuum. It was found that designing the structure in such a way that the quasi-confined final state of the device is pushed up into the continuum allows for a stronger transition probability while still maintaining a fairly well-defined absorption bandwidth.

In intraband transitions, both confined-to-confined and confined-to-extended, selection rules require that the electric-field vector of the detectable light be parallel to the direction of growth. This means that for unpolarized light at least 50% is lost to this constraint. It also means that for maximum detection, the light must enter the detector edge-on. This places constraints on the configuration of the detector.

In all absorption processes, the population of the initial state and the number of final states available are as important as the transition probability. It is the product of these factors that determine the total absorption and hence the efficiency of the detector.

The best known of infrared devices are the narrow band-gap alloy detectors that depend on the interband band-gap transition of the semiconductor. While providing the best figures of merit to date for commercially produced detectors, after many years of development, the growth and processing of these materials continue to be a challenge. Effort still continues in this field, including attempts to grow the alloy using molecular beam epitaxy (MBE) to improve reliability and uniformity, and to grow bandgap-engineered structures. However, such structures do not exhibit electrical tunability.

In electrically tunable infrared detectors the wavelength tunability achievable in Quantum Well Infrared Photodetectors (QWIPs) due to an applied electric field (Stark shift) is quite limited. To first order, the energy levels in a single quantum well all move equally with applied field, and thus any change in the energy spacing between levels is second order at best. To achieve appreciable tunability requires extensive modification of the well shape.

While narrow band-gap alloys continue to be the most commonly used technology, concerns over the growth and fabrication difficulties involved with these materials have caused researchers to explore alternate methods of detecting infrared light. First was the use of quantum wells as sources of confined electrons, taking advantage of the increase in transition probability with little regard for the niceties of the initial state energies. Then came a detector which used selection of a particular energy state in a single quantum well, transitioning to a quasi-continuum final state, and later to an even more strongly confined superlattice band final state, to give good frequency selection. This approach suffered from a low initial state population, and thus had relatively low quantum efficiencies.

The difficulties of low initial state population and the associated low quantum efficiency were solved by using a multi-period structure and using a waveguide to allow multiple passes through the device, bringing the quantum efficiency to 95% for polarized light. Large absorption was achieved by coupling to a quasi-continuum state and the dark current was lowered by widening the barrier. This resulted in a device that, by some measures, is competitive with state-of-the-art direct bandgap material systems.

Many of the prior art intraband detectors share certain characteristics. First, they take advantage of quantum states formed by interfaces or actual wells created by growth or doping. These effects can all be expressed as a change in the energy potential seen by the detection particle. Next, they all depend on a photon induced transition of the detection carrier from a well confined state to a less confined one. The efficiency of the detector is directly dependent upon the strength of this transition and thus, in an ideal detector, transition strength should be as large as possible. Because the dark current depends on the confinement of the initial state, and the escape rate of the final state affects the number of carriers that finally reach the contact, it is desirable to maximize the first, while minimizing the second.

Most of the prior art intraband detectors also use an electric field to sweep the detection carrier to the contact and, in the case of electrically-tunable devices, use the electric field to change the wavelength of the detected photon through Stark shift.

Finally, all of the prior art intraband detectors are based on simple conceptual designs: well to well, first to second state in a simple well shape, etc.

It is desirable to provide more efficient quantum structures that simultaneously maximize those quantities that are of the most importance for a given application. There is tremendous freedom in the selection of growth parameters in a band-gap engineered material, which is largely unexplored.

It is particularly desirable to provide a quantum well electrically-tunable infrared detector having a superior structure, especially wide tuning range and good signal-to-noise.

SUMMARY OF THE INVENTION

Briefly, in accordance with the invention, an electrically tunable infrared detector is constructed comprised of a quantum well semiconductor structure having two adjacent quantum states. The structure is electrically tunable by applied voltage and depends upon photon induced resonant tunneling between the quantum wells. An infrared tunable detector device having a large responsivity, sharp linewidth and wide tunability is defined by the following characteristics: a transmission matrix element in the range of $1.1 \times 10^{17}$/nm to $1.3 \times 10^{17}$/nm; and a tuning distance in the range of 20 Å to of 60 Å. Tuning distance is defined in chapter 5 of a dissertation referenced subsequently.

An advantage of this invention is that the electrically-tunable infrared detector exhibits large responsivity (ratio of detector output to light input), sharp linewidth (detector resolution), and wide tunability (average change in energy of detected light achieved per applied electrical bias).

The foregoing and other features and advantages of the invention will be apparent from the following more particular description of a preferred embodiment of the invention as illustrated in the accompanying drawings.

DESCRIPTION OF PREFERRED EMBODIMENTS

There are a number of quantities that are commonly quoted when discussing the merits of an infrared detector, some of which are represented by the following terms used in this specification: absorption coefficient: α; current responsivity: $R_{\lambda c}$; specific detectivity, D*; fractional bandwidth, (Δλ/λ); noise equivalent power, NEP; oscillator strength; quantum efficiency or quantum yield, η; response time, t; responsivity, R; and tunability. These terms and other terms used throughout this specification are more fully defined in the dissertation entitled "Electrically-Tunable Infrared Detectors Based on Intraband Transitions in Quantum Well Structures", by Kathryn Luz Doughty, University of California, Santa Barbara Calif. 93106, December 1995, which is incorporated herein by reference.

Figure 1A:
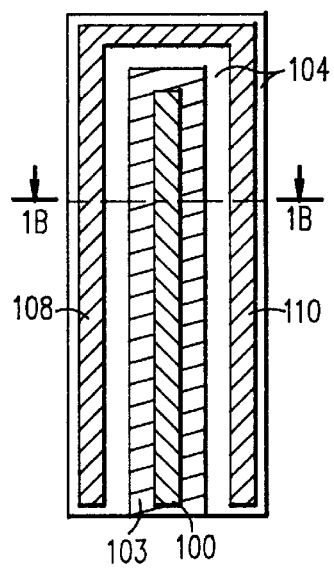
FIG. 1A and FIG. 1B are top and side views, respectively, of an electrically-tunable infrared detector apparatus in accordance with the present invention.
Figure 1B:
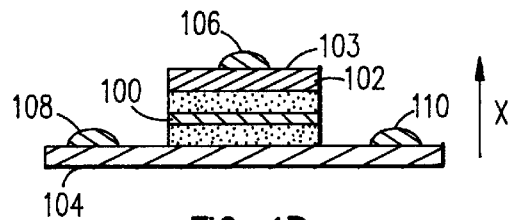

Refer to FIG. 1A and FIG. 1B which are top and side views, respectively, of an electrically-tunable infrared detector apparatus in accordance with the present invention. The invention is embodied in an electron-based device grown in the GaAs/AlGaAs material system. The present invention relates to band-gap engineered infrared detectors that detect incident light by way of an electronic state transition, translating detected photons into free carriers.

The device is constructed as a finger style contacting structure with an active region (100) sandwiched between a top contact (102) and a bottom contact (104). Devices grown on doped material and a back contact give rise to excessive free carrier absorption, so a buried contact layer (104) on an undoped substrate is used to solve this problem. Diodes are created by wet etching. A top contact pad (106) of metal is on the top contact mesa (103) and a bottom contact pad (108, 110) of metal is on the buried contact. Both top and bottom pads are Au/Ni/AuGe 1000 Å/250 Å/1000 Å ohmic contact pads and are defined simultaneously via a metal lift-off process and then are annealed.

Multiple iterations of the quantum structure are grown between the two contacts to increase the response of the device. This may lead to the build-up of high voltage drop regions, causing the voltage drop over the different iterations to vary, broadening the fractional bandwidth (Δλ/λ) of the device. However, since the response of devices is very weak with a single iteration, multiple iterations are used to increase the active region of the device, with doping layers placed to reduce the build-up of "hot spots".

Although doping of the contact layers is required to give good ohmic contacts, appropriate doping concentrations in the structure are computed that avoid excessive doping. Excessive doping could increase the free-carrier absorption of the infra-red light by conduction band electrons in the doped layers which is not desired.

Figure 2:
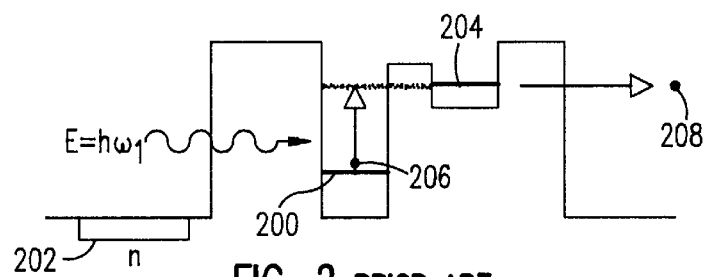
FIG. 2 is a conduction band diagram depicting the energy difference between two states in an unbiased quantum structure device of the prior art.

Refer to FIG. 2 which is a conduction band diagram depicting the energy difference between two states in an unbiased quantum structure device of the prior art. The initial state Ei (200) has a low energy and is relatively well confined, thus reducing the dark current. The electron population for this state is provided by an adjacent n-doped region (202). 50 Å undoped spacer layers placed between the contacts and active regions avoid defects due to doping being created in the well. The final state Ef (204) is the higher energy, quasi-confined state of the quantum structure. If an electron (206) in the initial state captures a photon of energy equal to the difference between the energies of the final and initial state, Ef–Ei, it can transition into the quasi-confined state, where it will experience a much greater probability of tunneling out of the well (208).

Figure 3:
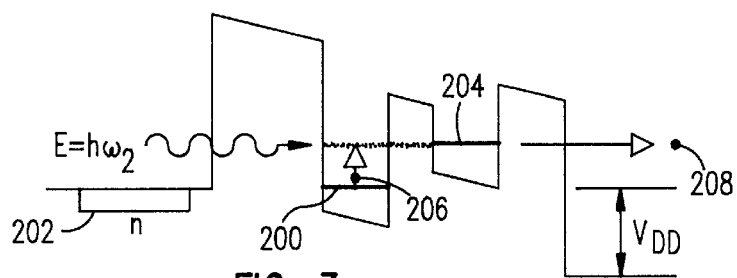
FIG. 3 is a conduction band diagram depicting the energy difference between two states in a quantum structure of the prior art that has a bias across the device.

Refer to FIG. 3 which is a conduction band diagram depicting the energy difference between two states in a quantum structure of the prior art that has a bias across the device. As shown in FIG. 3, applying an electric field bias ($V_{DD}$) across the device causes the entire energy potential to be Stark shifted, changing the energy difference between the two states, and as a consequence, changing the wavelength being detected. The applied electric field then assists transport of the detection electron to the contact. While the ground state energy is very deep in the well, it may still be above the Fermi level of the material. An initial amount of bias might therefore be required to bring this ground state close enough to the Fermi level to achieve good electron population of the initial state. Some bias is required in any case to sweep the detection electrons towards the contact.

Figure 4:
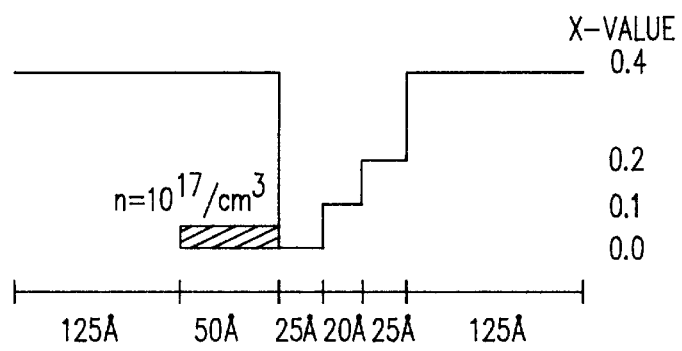
FIG. 4 is a conduction band diagram of a structure (YH2) grown for improved absorption α, that is a sample with a good <Ψ1|dΨ2>(matrix element) as well as a reasonable tuning distance.

Refer to FIG. 4 which is a conduction band diagram of a structure (YH2) grown for improved absorption α, that is a sample with a good $<\Psi 1|d\Psi 2>$ (matrix element) as well as a reasonable tuning distance. These parameters are the most relevant for a tunable detector, as the absorption of the detector is proportionate to $<\Psi 1|d\Psi 2>$, and tuning distance is a limiting factor in not only how quickly a detector tunes with increasing voltage, but in the tuning range as well.

The structure chosen for growth came from near the "good" region of the parameter space discussed on page 54 of the above-identified dissertation, which is seen to have $<\Psi 1|d\Psi 2>$ on the order of $1.3 \times 10^{17}$/nm. In the nomenclature of that dissertation, the structure can be described as |0 1 2|.

The widths of the slices were adjusted slightly to improve the tuning distance of the structure. This reduced the $<\Psi 1 d\Psi 2>$ to about $1.1 \times 10^{17}$/nm but was necessary as the tuning distance of the initial structure was quite short.

Figure 5:
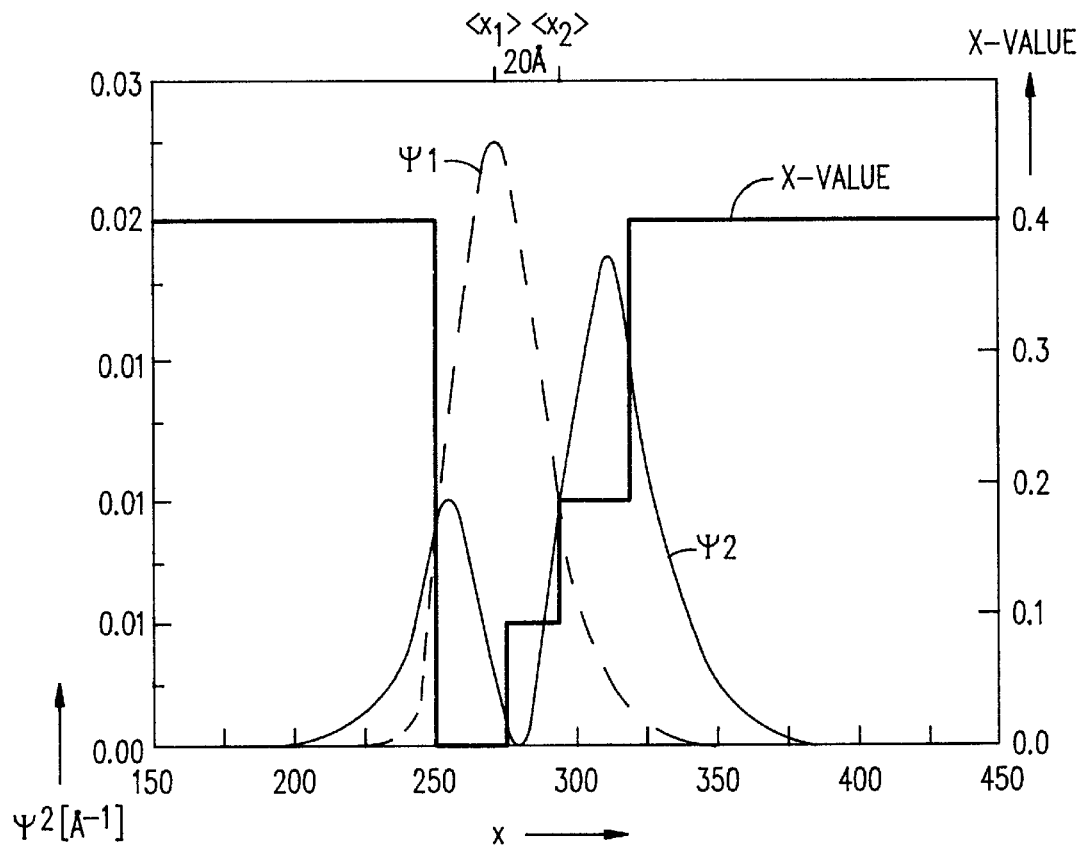
FIG. 5 illustrates wavefunctions calculated for quasi-confined states of a structure in accordance with the present invention.

Refer to FIG. 5 which illustrates wavefunctions calculated for quasi-confined states of a structure in accordance with the present invention. From the wavefunctions of the modes of the device shown in FIG. 5 it is seen that the asymmetry of the second state causes its average position to be separated from that of the first. This tuning distance was around 20 Å. Solid $Al_{0.4}GaAs$ barriers (250 Å) between instances of the structure were used to reduce the recapture rate of the excited electrons by the structure itself and thus improve the detection current.

The sample was grown using both aluminum sources available in the MBE chamber, one set to grow x-value=0.1 material, and the other to grow x-value=0.4. The x-value= 0.2 material was grown by "digital alloying" in which the x-value=0.4 shutter is quickly opened and closed for equal amounts of time, giving an average x-value of 0.2. The structure shown was repeated 25 times for increased detectivity, with a 0.5 mm $10^{17}/\mu m^3$ n-doped contact on top and a 250 Å undoped barrier and a 1.0 mm $10^{17}/\mu m^3$ n-doped buried contact on bottom. The structure was grown on a semi-insulating GaAs substrate. A 50 Å n-doped region to the left of each well provides initial population for the first state.

An X-ray diffraction rocking curve of the sample was taken. A brief description of X-ray diffraction and a schematic of the setup can be found in Appendix A of the above-identified dissertation.

Comparison of the X-ray spectrum with the predicted spectrum based on the specified growth (both shown in FIG. 34 of the above-identified dissertation) shows that the overall growth seems to be very close to the specification, with a 0.3% decrease in the total size of each iteration, as determined by applying Bragg's rule to the distance between modes in the spectrum. The peak widths are quite close to the prediction, indicating very consistent iterations (It should be noted that the peak widths are also a function of the alignment of the sample in the X-ray apparatus. Slight misalignment will broaden the peaks.) While the spacing of the modes can tell the total iteration width, it gives no information as to how that width is divided internally, beyond the information derivable from the average x-value.

The Photoluminescence (PL) spectrum (FIG. 35 of the above-identified dissertation) shows only the first e-hh transition in PL, as the spatial overlap between the first and second state is good, and thus the electrons fall quickly to the lower state via phonon emission. The predicted position of this peak is between 7308 Å and 7440 Å, with the bulk of the variation depending on the order in which the sources were shuttered to form the x-value=0.2 material. As can be seen, the peak is centered at 7305 Å. This can be explained by assuming that the 0.4 x-value shutter was opened first and last. This contention is supported by the results of a Fourier Transform Infra-red Spectroscopy (FTIR) spectra of the material. Fourier transform spectroscopy is an extremely useful way of testing a material's spectral absorption, especially in regions such as the infra-red where there are few strong sources available. The FTIR setup can also be used to test devices as detectors. An explanation of FTIR and a schematic of the setup can be found in Appendix A of the above-identified dissertation.

An FTIR scan of the device with a glancing impingement angle of 75° was taken at room temperature with bias set at zero. Light throughput was good, but there was no discernible peak.

The sample was tested in the FTIR setup as a detector. Diodes were formed on the material using standard processing techniques (see Appendix E of the above-identified dissertation). The sample was mounted at Brewster's angle. Front-side illumination through the contact was used to avoid potential difficulties with shorting of the bond wires to the holder. This did, however, make it difficult to make a good estimate of the amount of light actually reaching the active region and the spectrum could therefore not easily be normalized. The sample was cooled to liquid nitrogen temperature via a cold finger and placed in the light-path of the FTIR.

The diodes were driven with a trans-impedance amplifier (TIA), a current-mode preamplifier. This provided both amplification of the signal and bias for the device.

The output of the TIA was fed into the FTIR in place of the signal usually taken from the HgCdTe detector. The resultant signal was analyzed with the standard FTIR software.

Figure 6:
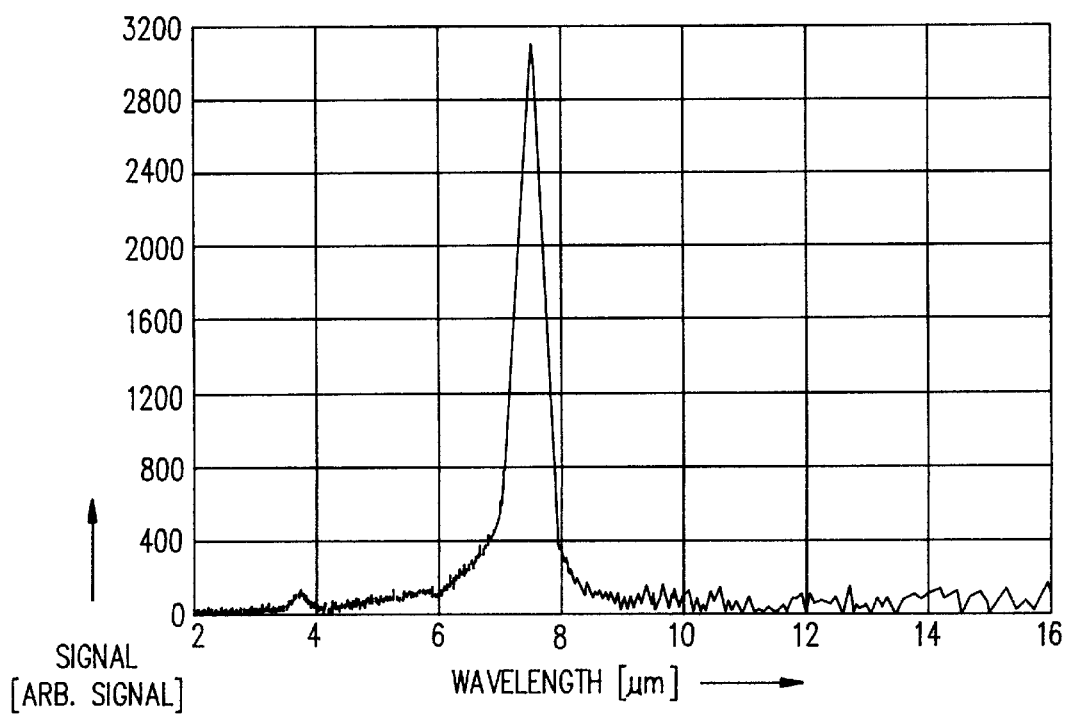
FIG. 6 shows the spectrum from a detector sample (unnormalized) under 5 V bias.

FIG. 6 shows the spectrum from a detector sample (unnormalized) under 5 V bias. The sample provided a clear signal, in this case centered at 16 meV or 7.5 $\mu$m, with a FWHM of about 10 meV or 0.56 $\mu$m.

Figure 7:
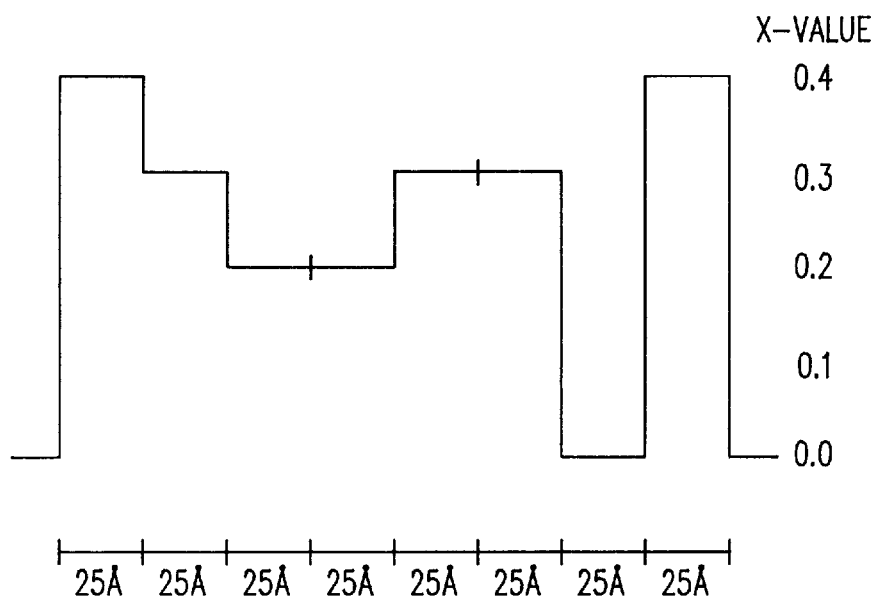
FIG. 7 is a conduction band diagram depicting a high tuning range/absorption detector in accordance with the present invention; and, FIG. 8 is a plot of tuning distance versus absorption comparing prior art tunable detectors with detectors constructed in accordance with the present invention.

Refer to FIG. 7 which is a conduction band diagram depicting a high tuning range/absorption detector in accordance with the present invention. This detector is slightly more complicated to grow than the YH2 structure shown in FIG. 4, it is well within the capability of MBE. This structure has a $<\Psi_1|d\Psi_2>$ in the 1.3 to $1.5 \times 10^{17}$ range, with a tuning distance of around 60 Å.

Figure 8:
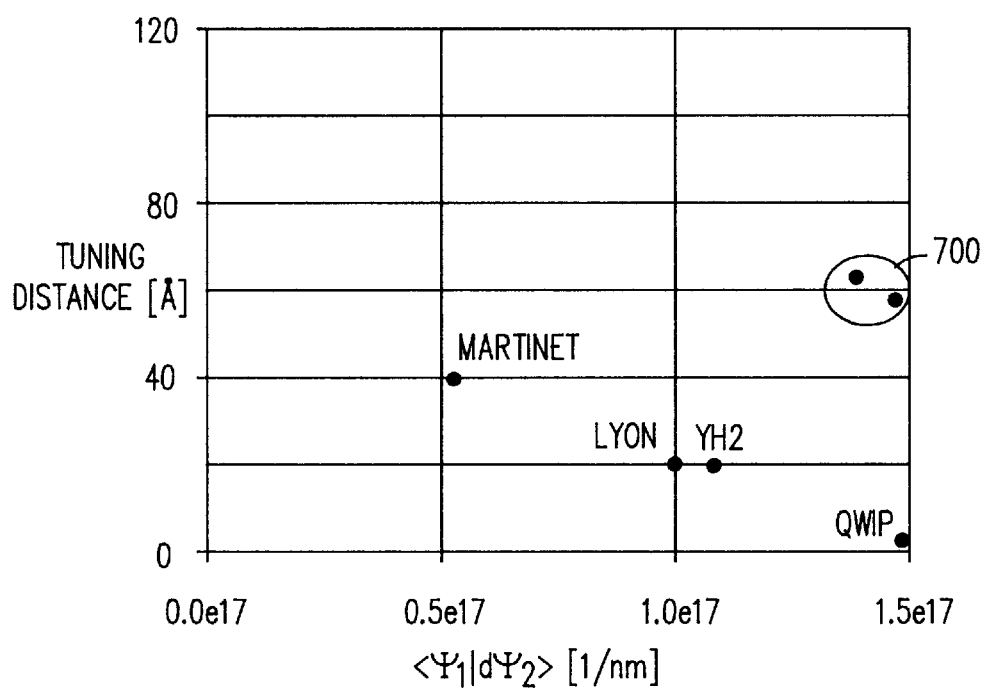

Refer to FIG. 8 which is a plot of tuning distance versus absorption comparing prior art tunable detectors with a detector constructed in accordance with the present invention. To compare this detector with the other tunable detectors the published results of Martinet, Lyon, a typical QWIP, and the YH2 device (the present invention) is plotted on a $<\Psi_1|d\Psi_2>$ versus tuning distance in FIG. 8.

In FIG. 8 it can be seen that, while QWIPs have a very high $<\Psi_1|d\Psi_2>$ and thus α, their tuning range is very limited, with an equivalent tuning distance of under 5 Å, due to asymmetry introduced into the well by the Stark shift. While Martinet's paper gave no values for absorption or $<\Psi_1|d\Psi_2>$, they are computed using their given structure.

While it has an appreciable tuning distance, Martinet's structure achieved this at a substantial loss in absorption. Lyon's structure regained some of this lost absorption, but with a loss in tuning distance. The YH2 structure of the present invention achieved a tuning distance comparable to Lyon's, but with an improvement in absorption. Of special interest are the points (700) shown from an exploration of the parameter space (circled). They are both variations on the structure shown in FIG. 7.

Method Of Determining Parameters

The two embodiments of the invention shown in FIG. 4 and FIG. 7 were discovered through the application of a novel method. The method comprises searching for and selecting optimum growth parameters for use in the fabrication of an optical device of multiple semiconductor layers of band-gap engineered material. This method may be used to discover other desirable configurations. While the method is described with respect to devices preferably grown in the GaAs/AlGaAs material system, it will be understood by those skilled in the art that the method may be applied to other systems as well.

Initially, suitable front barrier and back barrier layers are selected. The front barrier layer having a front barrier band edge at a front barrier band edge height and the back barrier layer having a back barrier band edge at a back barrier band edge height. The heights may have the same value (for example x-value 0.4). The width of the barrier layers may be, for example, 100 Å. The parameters for a central active region that is bounded by the front barrier layer and the back barrier layer are selected in accordance with the following method.

The central active region is divided into a number of specified slices, each slice having a slice band edge. Each slice band edge is limited to a slice band edge height that is not greater than the band edge heights of the front barrier layer and the back barrier layer. Each slice band edge height is then varied with respect to a specified number of growable semiconductor structures resulting in a number of specific slice band edge heights. From among the number of specific slice band edge heights, a selection is made, choosing those band edge heights that maximize (1) a tuning distance parameter and (2) an absorption parameter. The tuning distance parameter is related to a distance at which the device tunes in frequency and the absorption parameter is related to quantum efficiency of the device.

In the process of growing a structure, a first slice of the number of specified slices is fixed at a first band edge height, a second adjacent slice of the number of specified slices is fixed at a second band edge height and a third adjacent slice of the number of specified slices is fixed at a third band edge height that is greater than the second band edge height.

In the FIG. 4 embodiment of the invention, it can be observed that the first band edge height (x-value of 0.0) is less than the second band edge height (x-value of 0.1). More specifically, the first slice consists of GaAs; the second slice consists of $Al_{x1}GaAs$; and the third slice consists of $Al_{x2}GaAs$, wherein x2 is greater than x1. The front barrier layer and the back barrier layer consists of $Al_{x3}GaAs$, wherein x3 is greater than x2. In the FIG. 4 embodiment of the invention, x1 equals 0.1; x2 equals 0.2, and, x3 equals 0.4. The first slice has a width of approximately 25 Å, the second slice has a width of approximately 20 Å; and the third slice has a width of approximately 25 Å.

In the FIG. 7 embodiment of the invention, it can be observed that the first band edge height (x-value of 0.3) is greater than the second band edge height (x-value of 0.2). Also, in the FIG. 7 embodiment of the invention, a fourth adjacent slice is selected and is fixed at a fourth band edge height (x-value of 0.0) that is less than the first, second and third band edge heights. The first slice has a width of approximately 25 Å, the second slice has a width of approximately 50 Å; the third slice has a width of approximately 50 Å, and the fourth slice has a width of approximately 25 Å.

In should be understood by those skilled in the art that the parameters are not limited to those disclosed above exactly, but may be selected from within a range of parameters. The tuning distance parameter may fall within the range of 18 Å to 22 Å and the absorption parameter may fall within the range of a matrix element of $1.1 \times 10^{17}/nm$ to a matrix element of $1.3 \times 10^{17}/nm$.

What has been described is the fabrication of an electrically tunable device designed to have reasonable absorbance and overlap. Predicted characteristics were compared with results from PL, X-ray, and FTIR characterization, and the results were quite consistent. The material was tested as a device, and showed tuning characteristics and positions that are consistent with prediction. The device showed what seemed to be reasonable signal strength compared to a commercial HgCdTe detector.

While the invention has been particularly shown and described with reference to preferred embodiments thereof, it will be understood by those skilled in the art that the foregoing and other changes in form and detail may be made therein without departing from the scope of the invention.

What is claimed is:

1. A method of determining parameters used in fabricating an optical device of multiple layers of semiconductor material, said device including a front barrier layer having a front barrier band edge at a front barrier band edge height; a back barrier layer having a back barrier band edge at a back barrier band edge height; and a central active region bounded by said front barrier layer and said back barrier layer; said method comprising steps of:

A. dividing said central active region into a number of specified slices; each slice of said number of specified slices having a slice band edge, B. limiting each slice band edge to a slice band edge height that is not greater than said band edge heights of said front barrier layer and said back barrier layer;

C. varying each slice band edge height with respect to a specified number of growable semiconductor structures resulting in a number of specific slice band edge heights; and, D. selecting from among said number of specific slice band edge heights those band edge heights that maximize (1) a tuning distance parameter and (2) an absorption parameter;

said tuning distance parameter being related to a distance at which said device tunes in frequency;

said absorption parameter being related to quantum efficiency of said device.

2. The method of claim 1 wherein said step C further comprises steps of:

E. fixing a first slice of said number of specified slices at a first band edge height;

F. fixing a second slice of said number of specified slices at a second band edge height;

said second slice being adjacent said first slice; and,

G. fixing a third slice of said number of specified slices at a third band edge height that is greater than said second band edge height;

said third slice being adjacent said second slice.

3. The method of claim 2 wherein:
said first band edge height is less than said second band edge height.

4. The method of claim 2 wherein:
said first band edge height is greater than said second band edge height.

5. The method of claim 4 wherein said step C further comprises steps of:
fixing a fourth slice of said number of specified slices at a fourth band edge height that is less than said first, second and third band edge heights;
said fourth slice being adjacent said third slice.

6. The method of claim 2 wherein:
said first slice consists of GaAs;
said second slice consists of $Al_{x1}GaAs$; and,
said third slice consists of $Al_{x2}GaAs$, wherein x2 is greater than x1.

7. The method of claim 6 wherein:
said front barrier layer and said back barrier layer consists of $Al_{x3}GaAs$, wherein x3 is greater than x2.

8. The method of claim 7 wherein:
x1 equals 0.1;
x2 equals 0.2; and,
x3 equals 0.4.

9. The method of claim 3 wherein:
said first slice has a width of approximately 25 Å;
said second slice has a width of approximately 20 Å; and,
said third slice has a width of approximately 25 Å.

10. The method of claim 4 wherein:
said first slice has a width of approximately 25 Å;
said second slice has a width of approximately 50 Å; and,
said third slice has a width of approximately 50 Å.

11. The method of claim 5 wherein:
said first slice has a width of approximately 25 Å;
said second slice has a width of approximately 50 Å; and,
said third slice has a width of approximately 50 Å;
said fourth slice has a width of approximately 25 Å.

12. The method of claim 1 wherein said step D includes:
selecting said tuning distance parameter from within the range of 18 Å to 22 Å; and,
selecting said absorption parameter from within the range of a matrix element of $1.1 \times 10^{17}$/nm to a matrix element of $1.3 \times 10^{17}$/nm.

13. The method of claim 1 wherein said step D includes:
selecting said tuning distance parameter from within the range of 50 Å to 70 Å; and,
selecting said absorption parameter from within the range of a matrix element of $1.3 \times 10^{17}$/nm to a matrix element of $1.5 \times 10^{17}$/nm.

14. An optical device of multiple layers of semiconductor material comprising:
a front barrier layer having a front barrier band edge at a front barrier band edge height;
a back barrier layer having a back barrier band edge at a back barrier band edge height;
a central active region bounded by said front barrier layer and said back barrier layer;
said central active region consisting of a number of specified slices;
each slice of said number of specified slices having a band edge,
each band edge being at a band edge height that is less than said band edge heights of said front barrier layer and said back barrier layer;
a first slice of said number of specified slices having a first band edge;
a second slice of said number of specified slices having a second band edge;
said second slice being adjacent said first slice;
a third slice of said number of specified slices having a third band edge;
said third slice being adjacent said second slice; and,
said third band edge being at a third band edge height that is greater than said second band edge height.

15. The optical device of claim 14 wherein:
said first band edge height is less than said second band edge height.

16. The optical device of claim 14 wherein:
said first band edge height is greater than said second band edge height.

17. The optical device of claim 16 further comprising:
a fourth slice of said number of specified slices having a fourth band edge;
said fourth slice being adjacent said third slice; and,
said fourth band edge being at a fourth band edge height that is less than said first, second and third band edge heights.

18. The optical device of claim 14 wherein:
said first slice consists of GaAs;
said second slice consists of $Al_{x1}GaAs$; and,
said third slice consists of $Al_{x2}GaAs$, wherein x2 is greater than x1.

19. The optical device of claim 15 wherein:
said front barrier layer and said back barrier layer consists of $Al_{x3}GaAs$, wherein x3 is greater than x2.

20. The optical device of claim 15 wherein:
x1 equals 0.1;
x2 equals 0.2; and,
x3 equals 0.4.

21. The optical device of claim 15 wherein said central active region is characterized by:
said first slice having a thickness of 25 Å;
said second slice having a thickness of 20 Å; and,
said third slice having a thickness of 25 Å.

22. The optical device of claim 16 wherein said central active region is characterized by:
said first slice having a width of 25 Å;
said second slice having a width of 20 Å; and,
said third slice having a width of 25 Å.

23. The optical device of claim 14 wherein said central active region is characterized by:
a matrix element in the range of $1.1 \times 10^{17}$/nm to $1.3 \times 10^{17}$/nm; and,
a tuning distance in the range of 18 Å to 22 Å.

24. The optical device of claim 14 wherein said central active region is characterized by:
a matrix element in the range of $1.1 \times 10^{17}$/nm to $1.3 \times 10^{17}$/nm; and,
a tuning distance in the range of 18 Å to 22 Å.

25. An electrically tunable quantum-well infrared detector based on photon induced resonant tunneling between quantum wells characterized by:
a matrix element in the range of $1.1 \times 10^{17}$/nm to $1.3 \times 10^{17}$/nm; and, a tuning distance in the range of 18 Å to 22 Å.

26. An electrically tunable quantum-well infrared detector based on photon induced resonant tunneling between quantum wells characterized by:

a matrix element in the range of $1.3 \times 10^{17}$/nm to $1.5 \times 10^{17}$/nm; and, a tuning distance in the range of 50 Å to 70 Å.

27. An electrically tunable quantum-well infrared detector based on photon induced resonant tunneling between quantum wells characterized by:

a matrix element in the range of $1.1 \times 10^{17}$/nm to $1.5 \times 10^{17}$/nm; and, a tuning distance in the range of 18 Å to 70 Å.

\* \* \* \* \*